US011165276B2

(12) United States Patent
Wang et al.

(10) Patent No.: US 11,165,276 B2
(45) Date of Patent: Nov. 2, 2021

(54) ADAPTER

(71) Applicant: CYBER POWER SYSTEMS, INC., Taipei (TW)

(72) Inventors: Yu-Sheng Wang, Taipei (TW); Hong-Lun Wang, Taipei (TW); Cheng-Yang Su, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 338 days.

(21) Appl. No.: 15/639,333

(22) Filed: Jun. 30, 2017

(65) Prior Publication Data
US 2018/0337553 A1 Nov. 22, 2018

(30) Foreign Application Priority Data

May 19, 2017 (CN) .......................... 201710357381.2

(51) Int. Cl.
*H02J 9/06* (2006.01)
*H02H 5/04* (2006.01)
*H02H 1/00* (2006.01)
*G01R 19/00* (2006.01)
*G01R 31/40* (2020.01)
*H02H 3/04* (2006.01)
(Continued)

(52) U.S. Cl.
CPC .......... *H02J 9/061* (2013.01); *G01R 19/0084* (2013.01); *G01R 31/2825* (2013.01); *G01R 31/40* (2013.01); *H02H 1/0007* (2013.01); *H02H 3/044* (2013.01); *H02H 5/04* (2013.01); *H02J 9/06* (2013.01); *H02M 7/06* (2013.01)

(58) Field of Classification Search
CPC ......... H02J 9/061; H02H 1/0007; H02H 5/04; G01R 19/0084
USPC .......................................................... 307/64
See application file for complete search history.

(56) References Cited

U.S. PATENT DOCUMENTS 8,582,322 B2 * 11/2013 Liu ................... H02M 3/33507
363/21.04
9,167,645 B1 * 10/2015 Wu ....................... H05B 45/382
(Continued)

FOREIGN PATENT DOCUMENTS

CN 102684498 A 9/2012
CN 104965139 A 10/2015
(Continued)

*Primary Examiner* — Hal Kaplan
*Assistant Examiner* — Swarna N Chowdhuri
(74) *Attorney, Agent, or Firm* — Bacon & Thomas, PLLC

(57) ABSTRACT

A adapter having an inputting terminal and an outputting terminal is provided. The adapter further includes a converter having a first side and a second side, a testing switch having a first terminal and a second terminal, a detecting circuit and a first indicator. The first side is coupled to the inputting terminal. The second side is coupled to the outputting terminal. The converter is used to convert inputting power for providing outputting power to a load system. The first terminal is coupled to the second side. The detecting circuit is coupled to the second terminal. When the first terminal and the second terminal of the testing switch are conducted, the load system is disconnected with the adapter by the detecting circuit. The detecting circuit is used to detect an outputting signal for generating a detecting result. The first indicator sends a message according to the detecting result.

45 Claims, 2 Drawing Sheets

(51) Int. Cl.
*G01R 31/28* (2006.01)
*H02M 7/06* (2006.01)

(56) References Cited

U.S. PATENT DOCUMENTS

| | | | |
|---|---|---|---|
| 9,906,143 B1* | 2/2018 | Yu | H02H 7/1213 |
| 2007/0040516 A1* | 2/2007 | Chen | H05B 39/045 |
| | | | 315/291 |
| 2007/0208981 A1* | 9/2007 | Restrepo | H02H 1/0015 |
| | | | 714/731 |
| 2008/0231229 A1* | 9/2008 | Aradachi | H02J 7/045 |
| | | | 320/107 |
| 2012/0182039 A1* | 7/2012 | Partee | G01R 31/40 |
| | | | 324/764.01 |
| 2012/0268063 A1* | 10/2012 | Qiu | H02J 7/04 |
| | | | 320/107 |
| 2014/0063878 A1* | 3/2014 | Tsai | G05F 3/00 |
| | | | 363/74 |
| 2016/0329816 A1* | 11/2016 | Zhang | H02M 3/33507 |

FOREIGN PATENT DOCUMENTS

| | | |
|---|---|---|
| TW | 2014_11984 A | 3/2014 |
| TW | M496762 U | 3/2015 |

\* cited by examiner

ADAPTER

BACKGROUND OF THE INVENTION

Field of the Invention

The present invention relates to a adapter, and more particularly, the present invention is relates to a adapter having a testing circuit.

Description of Related Art

With the popularity of various types of electrical equipment, adapters are also widely used in various types of electrical equipment. However, the current detecting technology only provides the short-circuit detection of the circuit system in the adapter. The current detecting technology can not provide exhaustive electrical detection of the circuit system for determining fault states. Therefore, the required time for fault determining or troubleshooting increases substantially, and increases maintaining costs.

SUMMARY OF THE INVENTION

Accordingly, an object of the present invention is to provide a adapter, which has a testing circuit to determine circuit state and fault state of the adapter quickly.

To achieve the foregoing and other objects, a adapter s provided. The adapter has an inputting terminal and an outputting terminal. The adapter further comprises a converter, a testing switch, a detecting circuit and a first indicator. The inputting terminal is suitable for receiving an inputting power. The outputting terminal is suitable for providing an outputting power to a load system. The converter has a first side and a second side. The first side and the inputting terminal are coupled electrically. The second side and the outputting terminal are coupled electrically. The inputting power is converted by the converter for providing the outputting power to the load system. The testing switch has a first terminal and a second terminal. The first terminal and the second side of the converter are coupled electrically. The detecting circuit is coupled to the second terminal of the testing switch electrically. Wherein, when the first terminal and the second terminal of the testing switch are conducted, the detecting circuit performs the disconnection of the load system and detects the outputting signal at the second side of the converter for generating a detecting result, and the first indicator sends a message according to the detecting result.

In one embodiment of the present invention, the testing switch and the load system are coupled to the second side of the converter in parallel.

In one embodiment of the present invention, the adapter further comprises a second indicator coupled to the second side of the converter electrically, the second indicator and the testing switch are coupled to the second side of the converter in parallel.

In one embodiment of the present invention, the detecting circuit includes a load switching circuit and a voltage detecting circuit. The load switching circuit is coupled to the second terminal of the testing switch electrically. The voltage detecting circuit is coupled to the load switching circuit electrically for detecting the voltage range at the second side of the converter to generate the detecting result, and sends the detecting result to the first indicator.

In one embodiment of the present invention, when the first terminal and the second terminal of the testing switch are conducted, the load switching circuit performs the disconnection of the load system, and the voltage detecting circuit detects the voltage range at the second side of the converter for generating the detecting result.

In one embodiment of the present invention, the adapter further comprises a load switcher coupled between the testing switch and the outputting terminal electrically.

In one embodiment of the present invention, the detecting circuit further comprises an over temperature protector coupled to the load switching circuit electrically.

In one embodiment of the present invention, the adapter further comprises a surge protector, a rectifier and a bulk capacitor, the surge protector, the rectifier and the bulk capacitor are coupled to the first side of the converter in series.

In one embodiment of the present invention, the rectifier is a diode bridge.

In one embodiment of the present invention, the adapter further comprises a protector coupled between the second side of the converter and the testing switch electrically, wherein the protector is an over-voltage protector, an over-current protector or a short circuit protector.

In one embodiment of the present invention, the adapter further comprises a PWM controller, one terminal of the PWM controller is coupled to the first side of the converter electrically, the PWM controller detects the energy variations of auxiliary winding at the first side of the converter to control the first side of the converter for adjusting energy transmitted to the converter from the inputting terminal.

In one embodiment of the present invention, adapter further comprises a PWM controller and a feedback circuit, one terminal of the PWM controller is coupled to the first side of the converter electrically, another terminal of the PWM controller is coupled to the feedback circuit, the feedback circuit is coupled between the second side of the converter and the PWM controller electrically, the PWM controller detects the output of the feedback circuit to control the first side of the converter for adjusting energy transmitted to the converter from the inputting terminal.

In one embodiment of the present invention, the converter is a transformer, an isolated converter, an isolated transformer, a non-isolated converter, or a non-isolated transformer.

In one embodiment of the present invention, the testing switch is switched between a conductive state and a disconnected state.

In one embodiment of the present invention, the adapter further comprising a switching circuit, one terminal of the switching circuit is coupled to the second side of the converter electrically, another terminal of the switching circuit is coupled to a auxiliary power, the switching circuit detects the output at the second side of the converter for controlling the electrical discharge of the auxiliary power.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
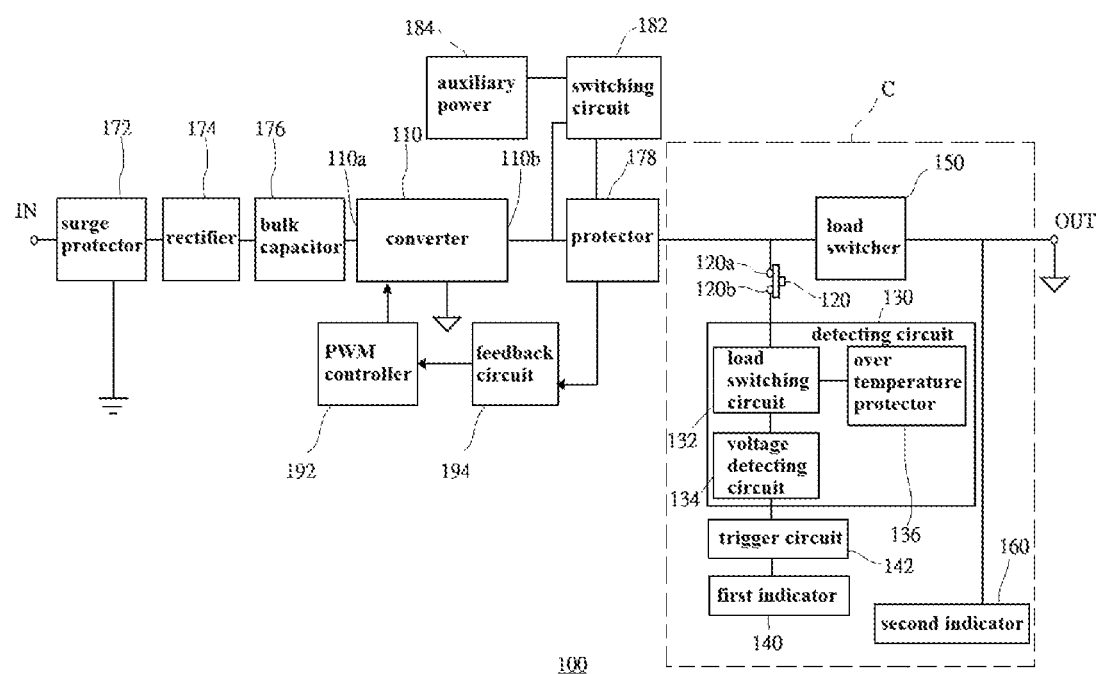
FIG. 1 is a schematic view illustrating a adapter according to one embodiment of the present invention.

FIG. 1 is a schematic view illustrating a adapter according to one embodiment of the present invention. Referring to FIG. 1, a adapter 100 of the present embodiment has an inputting terminal IN and an outputting terminal OUT. The adapter 100 further includes a converter 110, a testing switch 120, a detecting circuit 130 and a first indicator 140. The inputting terminal IN is suitable for receiving an inputting power. The outputting terminal OUT is suitable for providing an outputting power to a load system (not shown). In addition, the converter 110 is coupled between the inputting terminal IN and the outputting terminal OUT electrically. The inputting power can be converted by the converter 110 for providing the outputting power to a load system. Besides, the converter 110 can be a transformer, an isolated transformer or an isolated converter.

In the present embodiment, the converter 110 has a first side 110a and a second side 110b, for example. The first side 110a of the converter 110 is coupled to the inputting terminal IN electrically. The second side 110b of the converter 110 is coupled to the outputting terminal OUT electrically. Wherein, when the converter 110 is, for example, a transformer, the first side 110a of the converter 110 is, for example, configured with a auxiliary winding, and the second side 110b of the converter 110 is configured with at least one output winding.

From above, the inputting voltage can be converted by the converter 110 for providing the outputting voltage to the load system. In the present embodiment, the load system is, for example, network device or other electrical devices, the particulars described herein are not intended to limit the present embodiment.

From above, the testing switch 120 of the present embodiment and the load system are, for example, coupled to the second side 110b of the converter 110 in parallel. Further, the testing switch 120 of the present embodiment has a first terminal 120a and a second terminal 120b. Wherein, the first terminal 120a of the testing switch 120 and the second side 110b of the converter 110 are coupled electrically, and the detecting circuit 130 is coupled to the second terminal 120b of the testing switch 120 electrically.

Worth mention, in the present embodiment, the adapter 100 has a testing circuit C, and at least portion of the foregoing testing switch 120 is, for example, exposed out of body of the adapter. Therefore, when the testing switch 120 is pressed to conduct the first terminal 120a and the second terminal 120b of the testing switch 120, the detecting circuit 130 will performs the disconnection of the load system and detects the outputting signal at the second side 110b of the converter 110 for generating a detecting result. Then, the first indicator 140 will sends a message according to detecting result. Thus, the testing circuit of the adapter 100 in the present embodiment can determine circuit state or fault state of the adapter quickly according to message type send by the first indicator 140.

Further, the detecting circuit 130 of the present embodiment includes, for example, a load switching circuit 132 and a voltage detecting circuit 134. Wherein, the load switching circuit 132 is coupled to the second terminal 120b of the testing switch 120 electrically, and the voltage detecting circuit 134 is coupled to the load switching circuit 132 electrically. In the present embodiment, the voltage detecting circuit 134 is used to detect output voltage range at the second side 110b of the converter 110. Therefore, when the first terminal 120a and the second terminal 120b of the testing switch 120 are conducted and the load switching circuit 132 performs the disconnection of the load system, the voltage detecting circuit 134 will detects voltage range at the second side 110b of the converter 110 for generating the foregoing detecting result. Then, the detecting result can be transmitted to the first indicator 140. In addition, the detecting circuit 130 of the present embodiment further include an over temperature protector 136. The over temperature protector 136 of the present embodiment is coupled to the load switching circuit 132 electrically for providing an over temperature protecting mechanism.

In a preferred embodiment, the first indicator 140 is, for example, light indicator, and the detecting result can be the outputting voltage range at second side 110b of the converter 110. Thus, the first indicator 140 can indicate whether the voltage range at second side 110b of the converter 110 is maintained in a standard range by emitting different colors or different flicker frequency lights. In other words, the testing circuit C of the present embodiment can provides the circuit working state of the adapter 100 for determining the circuit state or fault state of the adapter quickly.

In detail, when the detecting result is the outputting voltage range at the second side 110b of the converter 110 and the outputting voltage range is maintained in the standard range, the light indicator can emits lights with a first color. When the detecting result is the outputting voltage range at the second side 110b of the converter 110 and the outputting voltage range is out of the standard range, the light indicator can emits lights with a second color. Wherein, the first color is, for example, green. The second color is, for example, red. Thus, a warning message can be presented obviously.

In addition, the first indicator 140 is not actuated when the testing switch 120 is pressed to conduct the first terminal 120a and the second terminal 120b of the testing switch 120, this means that a short circuit or other fault condition may be occurred in the adapter so that the first indicator 140 is not powered. In other words, when the first indicator 140 is, for example, light indicator, and the testing switch 120 is conductive and no light is emitted from the light indicator, a short circuit or other fault condition may be occurred in the circuit of the adapter. On the other hand, if the light indicator emits green light, the circuit of the adapter is in normal state. Relatively, if the light indicator emits red light, the outputting voltage range of the converter 110 in adapter is out of the standard range, which means that the circuit of the adapter is in fault condition.

The foregoing first indicator 140 is the light indicator, for example. In other embodiments, the first indicator 140 also can be a sound indicator or other suitable indicators. Similarly, fault styles or circuit states of the adapter also can be determined quickly by different types of sound sources. In addition, in the present embodiment, the first indicator 140 is, for example, triggered by a trigger circuit 142 coupled between the first indicator 140 and the voltage detecting circuit 134 electrically for performing the instructions.

Besides, the testing switch 120 of the present embodiment is, for example, switched between a conductive state and a disconnected state. In detail, the conductive state of the testing switch 120 is, for example, the state that the first terminal 120a of the testing switch 120 is coupled to the second terminal 120b of the testing switch 120 electrically. Relatively, the disconnected state of the testing switch 120 is, for example, the state that the first terminal 120a of the testing switch 120 is not coupled to the second terminal 120b of the testing switch 120 electrically. Further, because at least portion of the testing switch 120 in the present embodiment is, for example, exposed out of body of adapter. Therefore, when the adapter is required to test and the testing switch 120 exposed out of body of adapter is pressed, the first terminal 120a of the testing switch 120 is coupled to the second terminal 120b of the testing switch 120 electrically for being the conductive state. On the contrary, when the testing switch 120 exposed out of body of adapter is not pressed, the first terminal 120a of the testing switch 120 is not coupled to the second terminal 120b of the testing switch 120 electrically, the testing switch 120 is in the disconnected state.

Here, the practice method of the present invention about the disconnection of the load system from the detecting circuit 130 is further explained. In detail, in the present embodiment, a load switcher 150 is, for example, coupled between the testing switch 120 and the outputting terminal OUT electrically. Therefore, when the first terminal 120a of the testing switch 120 and the second terminal 120b are conducted, the load switching circuit 132 of the detecting circuit 130 performs the disconnection of the load system by the load switcher 150. The load system is, for example, located outside of the adapter. Then, the outputting signal at the second side 110b of the converter 110 is detected by the voltage detecting circuit 134 of the detecting circuit 130 for generating the foregoing detecting result. Thereafter, the first indicator 140 will sends the message according to the detecting result. Further, when the load switching circuit 132 performs the disconnection of the load system by the load switcher 150, the voltage detecting circuit 134 will detects whether the outputting voltage range of the second side 110b in the converter 110 is maintained in the standard range by applying various loading degrees. Wherein, the load switching circuit 132 and the load switcher 150 can be practiced in a relay.

In a preferred embodiment, the testing circuit of the adapter 100 also includes a second indicator 160. The second indicator 160 of the present embodiment is also coupled to the second side 110b of the converter 110 electrically. The second indicator 160 and the testing switch 120 are, for example, coupled to the second side 110b of the converter 110 in parallel. Wherein, the second indicator 160 of the present embodiment is, for example, coupled between the load switcher 150 and the outputting terminal OUT electrically. Further, when the testing switch 120 exposed out of body of the adapter is not pressed, the load switching circuit 132 will not disconnect the load system located outside of the adapter by the load switcher 150. Therefore, the second indicator 160 coupled between the load switcher 150 and the outputting terminal OUT electrically can indicate whether the outputting terminal OUT is in normal state of power supply for operator's reference. The same as above, when the second indicator 160 is, for example, a light indicator. When the testing switch 120 is conductive and no light is emitted from the light indicator, a short circuit or other fault condition may be occurred in the circuit of the adapter.

In short, in the present embodiment, the second indicator 160 is, for example, only used for references of power supply status, short circuit or other fault conditions of the adapter. In addition, the first indicator 140 is used to indicate whether the outputting voltage range of the converter 110 is maintained in the standard range. In other words, the present embodiment indicates various fault conditions quickly to determine circuit state or other fault states of the adapter by multiple indicators respectively. Certainly, in the state of being configured with multiple indicators, pressing switchers (not shown) can disposed in body of the adapter for testing.

In a preferred embodiment, the testing circuit of the adapter 100 can includes a surge protector 172, a rectifier 174 and a bulk capacitor 176. The rectifier 174 is, for example, a diode bridge. The foregoing surge protector, rectifier and the bulk capacitor are, for example, coupled to the first side 110a of the converter 110 in series. In addition, the testing circuit of the adapter 100 further includes a protector 178. The protector 178 is, for example, coupled between the second side 110b of the converter 110 and the testing switch 120 electrically. The protector 178 is an over-voltage protector, an over-current protector or a short circuit protector.

In a preferred embodiment, the testing circuit of the adapter 100 can includes a switching circuit 182. One terminal of the switching circuit 182 is coupled to the second side 110b of the converter 110 electrically, another terminal of the switching circuit 182 is coupled to the a auxiliary power 184. In the present embodiment, the switching circuit 182 can detect the output of the second side of converter 110 for controlling the electrical discharge of the auxiliary power 184. This means, when no any inputting power is received by the inputting terminal IN, the switching circuit 182 can detect that no any outputting power is outputted in the second side of the converter 110. Therefore, the switching circuit 182 can control the auxiliary power 184 to perform the electrical discharge for providing the work of the load system. The auxiliary power 184 is, for example, a battery.

In a preferred embodiment, the testing circuit of the adapter 100 further includes a PWM controller 192 and a feedback circuit 194. In the present embodiment, one terminal of the PWM controller 192 is coupled to the first side 110a of the converter 110 electrically, and another terminal of the PWM controller 192 is coupled to the feedback circuit 194. On the other hand, the feedback circuit 194 is coupled between the second side 110b of the converter 110 and the PWM controller 192 electrically. Thus, the PWM controller 192 can detect output of the feedback circuit for controlling the first side 110a of the adapter converter 110 and adjusting the power transmitted to the converter 110 through the inputting terminal IN.

In a preferred embodiment, the converter 110 can be a transformer, an isolated converter, an isolated transformer, a non-isolated converter or a non-isolated transformer.

Figure 2:
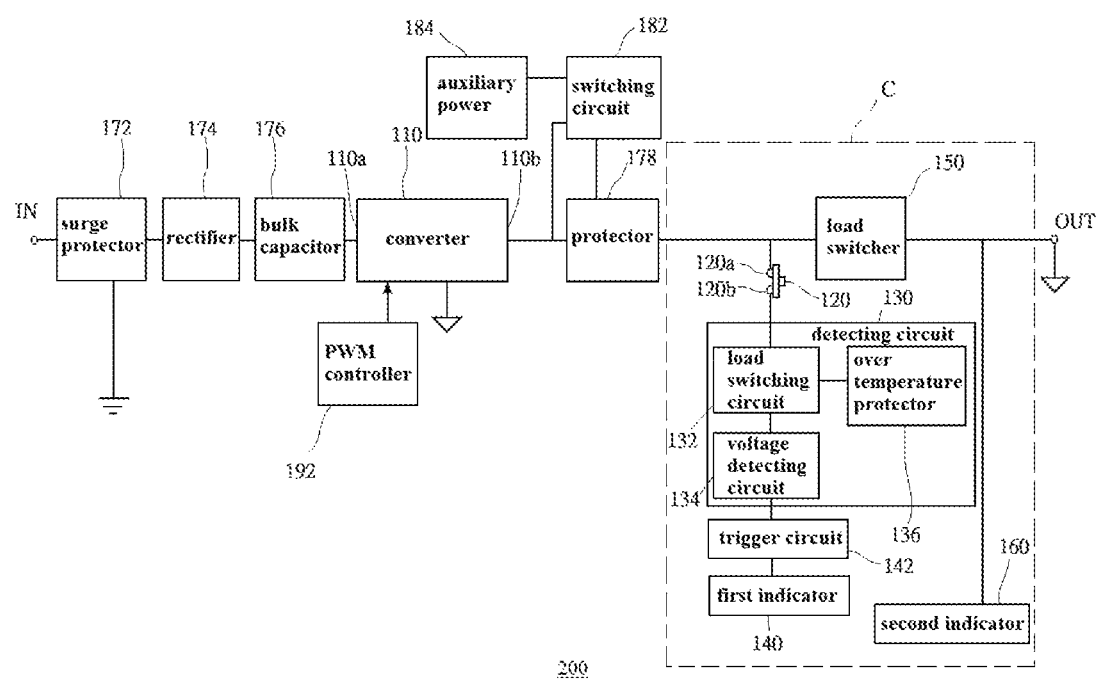
FIG. 2 is a schematic view illustrating a adapter according to another embodiment of the present invention.

FIG. 2 is a schematic view illustrating a adapter according to another embodiment of the present invention. Referring to FIG. 2, similar to the PWM controller 192 shown in FIG. 1, in a testing circuit of adapter 200 of the present embodiment, one terminal of the PWM controller 192 is coupled to the first side 110a of the converter 110 electrically. Further, the PWM controller 192 of the present embodiment can detect the energy variations of auxiliary winding at the first side 110a of the converter 110 for controlling the first side 110a of the converter 110 to adjust energy transmitted to the converter from the inputting terminal IN.

To sum up, in the present invention, the testing circuit having at least one testing switch is integrated inside of adapter, and at least portion of the testing switch is exposed out of body of the adapter. Therefore, when the testing switch is pressed to conduct two terminals of the testing switch, the detecting circuit of the present invention will disconnect the load system and detect the outputting signal of converter for generating the detecting result. Then, the indicator can sends a message according to the detecting result. Thus, in the present invention, the testing circuit of the adapter can determine circuit state or fault state of adapter quickly according to message type send by the indicator.

In other words, in the present invention, because the testing circuit of the adapter is integrated inside of adapter, so that users can perform the self-test for the adapter to understand the health status of the adapter circuit. On the other hand, when users perform the self-test for determining the circuit state or fault state of the adapter, maintaining costs can be reduced substantially.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An adapter, comprising:
an inputting terminal, receiving an inputting power;
an outputting terminal, providing an outputting power to a load system;
a converter, having a first side and a second side, the first side and the inputting terminal are coupled electrically, the second side and the outputting terminal are coupled electrically, the inputting power is converted by the converter for providing the outputting power to the load system;
a testing switch, having a first terminal and a second terminal, the first terminal and the second side of the converter are coupled electrically;
a detecting circuit, coupled to the second terminal of the testing switch electrically; and
a first light indicator;
wherein, when the first terminal and the second terminal of the testing switch are conducted, the detecting circuit performs the disconnection of the load system and detects a voltage range at the second side of the converter for generating a detecting result, and the first light indicator sends a message according to the detecting result,
wherein when the detecting result is that the voltage range at the second side of the converter is maintained in a predetermined range, the first light indicator emits light with a first color, and when the detecting result is that the voltage range at second side of the converter is out of the predetermined range, the first light indicator sends emits light with a second color.

2. The adapter according to claim 1, wherein the testing switch and the load system are coupled to the second side of the converter in parallel.

3. The adapter according to claim 1, further comprising a second indicator, coupled to the second side of the converter electrically, the second indicator and the testing switch are coupled to the second side of the converter in parallel.

4. The adapter according to claim 1, wherein the detecting circuit comprising:
a load switching circuit, coupled to the second terminal of the testing switch electrically; and
a voltage detecting circuit, coupled to the load switching circuit electrically for detecting the voltage range at the second side of the converter to generate the detecting result, and sends the detecting result to the first light indicator.

5. The adapter according to claim 4, wherein when the first terminal and the second terminal of the testing switch are conducted, the load switching circuit performs the disconnection of the load system, and the voltage detecting circuit detects the voltage range at the second side of the converter for generating the detecting result.

6. The adapter according to claim 4, further comprising a load switcher, coupled between the testing switch and the outputting terminal electrically.

7. The adapter according to claim 4, wherein the detecting circuit further comprising an over temperature protector, coupled to the load switching circuit electrically.

8. The adapter according to claim 1, further comprising a surge protector, a rectifier and a bulk capacitor, the surge protector, the rectifier and the bulk capacitor are coupled to the first side of the converter in series.

9. The adapter according to claim 8, wherein the rectifier is a diode bridge.

10. The adapter according to claim 1, further comprising a protector, coupled between the second side of the converter and the testing switch electrically, wherein the protector is an over-voltage protector, an over-current protector or a short circuit protector.

11. The adapter according to claim 1, further comprising a PWM controller, one terminal of the PWM controller is coupled to the first side of the converter electrically, the PWM controller detects energy variations of auxiliary winding at the first side of the converter to control the first side of the converter for adjusting energy transmitted to the converter from the inputting terminal.

12. The adapter according to claim 1, further comprising a PWM controller and a feedback circuit, one terminal of the PWM controller is coupled to the first side of the converter electrically, another terminal of the PWM controller is coupled to the feedback circuit, the feedback circuit is coupled between the second side of the converter and the PWM controller electrically, the PWM controller detects the output of the feedback circuit to control the first side of the converter for adjusting energy transmitted to the converter from the inputting terminal.

13. The adapter according to claim 1, wherein the converter is a transformer, an isolated converter, an isolated transformer, a non-isolated converter, or a non-isolated transformer.

14. The adapter according to claim 1, wherein the testing switch is switched between a conductive state and a disconnected state.

15. The adapter according to claim 1, further comprising a switching circuit, one terminal of the switching circuit is coupled to the second side of the converter electrically, another terminal of the switching circuit is coupled to an auxiliary power, the switching circuit detects the output at the second side of the converter for controlling the electrical discharge of the auxiliary power.

16. An adapter, comprising:
an inputting terminal, receiving an inputting power;
an outputting terminal, providing an outputting power to a load system;
a converter, having a first side and a second side, the first side and the inputting terminal are coupled electrically, the second side and the outputting terminal are coupled electrically, the inputting power is converted by the converter for providing the outputting power to the load system;
a testing switch, having a first terminal and a second terminal, the first terminal and the second side of the converter are coupled electrically;
a detecting circuit, coupled to the second terminal of the testing switch electrically; and
a first light indicator;
wherein, when the first terminal and the second terminal of the testing switch are conducted, the detecting circuit performs the disconnection of the load system and detects a voltage range at the second side of the converter for generating a detecting result, and the first light indicator sends a message according to the detecting result,
wherein when the detecting result is that the voltage range at the second side of the converter is maintained in a predetermined range, the first light indicator emits light with a first flicker frequency, and when the detecting result is that the voltage range at second side of the converter is out of the predetermined range, the first light indicator emits light with a second flicker frequency.

17. The adapter according to claim 16, wherein the testing switch and the load system are coupled to the second side of the converter in parallel.

18. The adapter according to claim 16, further comprising a second light indicator, coupled to the second side of the converter electrically, the second light indicator and the testing switch are coupled to the second side of the converter in parallel.

19. The adapter according to claim 16, wherein the detecting circuit comprising:
a load switching circuit, coupled to the second terminal of the testing switch electrically; and
a voltage detecting circuit, coupled to the load switching circuit electrically for detecting the voltage range at the second side of the converter to generate the detecting result, and sends the detecting result to the first light indicator.

20. The adapter according to claim 19, wherein when the first terminal and the second terminal of the testing switch are conducted, the load switching circuit performs the disconnection of the load system, and the voltage detecting circuit detects the voltage range at the second side of the converter for generating the detecting result.

21. The adapter according to claim 19, further comprising a load switcher, coupled between the testing switch and the outputting terminal electrically.

22. The adapter according to claim 19, wherein the detecting circuit further comprising an over temperature protector, coupled to the load switching circuit electrically.

23. The adapter according to claim 16, further comprising a surge protector, a rectifier and a bulk capacitor, the surge protector, the rectifier and the bulk capacitor are coupled to the first side of the converter in series.

24. The adapter according to claim 23, wherein the rectifier is a diode bridge.

25. The adapter according to claim 16, further comprising a protector, coupled between the second side of the converter and the testing switch electrically, wherein the protector is an over-voltage protector, an over-current protector or a short circuit protector.

26. The adapter according to claim 16, further comprising a PWM controller, one terminal of the PWM controller is coupled to the first side of the converter electrically, the PWM controller detects energy variations of auxiliary winding at the first side of the converter to control the first side of the converter for adjusting energy transmitted to the converter from the inputting terminal.

27. The adapter according to claim 16, further comprising a PWM controller and a feedback circuit, one terminal of the PWM controller is coupled to the first side of the converter electrically, another terminal of the PWM controller is coupled to the feedback circuit, the feedback circuit is coupled between the second side of the converter and the PWM controller electrically, the PWM controller detects the output of the feedback circuit to control the first side of the converter for adjusting energy transmitted to the converter from the inputting terminal.

28. The adapter according to claim 16, wherein the converter is a transformer, an isolated converter, an isolated transformer, a non-isolated converter, or a non-isolated transformer.

29. The adapter according to claim 16, wherein the testing switch is switched between a conductive state and a disconnected state.

30. The adapter according to claim 16, further comprising a switching circuit, one terminal of the switching circuit is coupled to the second side of the converter electrically, another terminal of the switching circuit is coupled to an auxiliary power, the switching circuit detects the output at the second side of the converter for controlling the electrical discharge of the auxiliary power.

31. An adapter, comprising:
an inputting terminal, receiving an inputting power;
an outputting terminal, providing an outputting power to a load system;
a converter, having a first side and a second side, the first side and the inputting terminal are coupled electrically, the second side and the outputting terminal are coupled electrically, the inputting power is converted by the converter for providing the outputting power to the load system;
a testing switch, having a first terminal and a second terminal, the first terminal and the second side of the converter are coupled electrically;
a detecting circuit, coupled to the second terminal of the testing switch electrically; and
a sound indicator;
wherein, when the first terminal and the second terminal of the testing switch are conducted, the detecting circuit performs the disconnection of the load system and detects a voltage range at the second side of the converter for generating a detecting result, and the sound indicator makes sound according to the detecting result,
wherein when the detecting result is that the voltage range at the second side of the converter is maintained in a predetermined range, the sound indicator makes sound with a first type, and when the detecting result is that the voltage range at second side of the converter is out of the predetermined range, the sound indicator makes sound with a second type.

32. The adapter according to claim 31, wherein the testing switch and the load system are coupled to the second side of the converter in parallel.

33. The adapter according to claim 31, further comprising a light indicator, coupled to the second side of the converter electrically, the light indicator and the testing switch are coupled to the second side of the converter in parallel.

34. The adapter according to claim 31, wherein the detecting circuit comprising:
a load switching circuit, coupled to the second terminal of the testing switch electrically; and
a voltage detecting circuit, coupled to the load switching circuit electrically for detecting the voltage range at the second side of the converter to generate the detecting result, and sends the detecting result to the sound indicator.

35. The adapter according to claim 34, wherein when the first terminal and the second terminal of the testing switch are conducted, the load switching circuit performs the disconnection of the load system, and the voltage detecting circuit detects the voltage range at the second side of the converter for generating the detecting result.

36. The adapter according to claim 34, further comprising a load switcher, coupled between the testing switch and the outputting terminal electrically.

37. The adapter according to claim 34, wherein the detecting circuit further comprising an over temperature protector, coupled to the load switching circuit electrically.

38. The adapter according to claim 31, further comprising a surge protector, a rectifier and a bulk capacitor, the surge protector, the rectifier and the bulk capacitor are coupled to the first side of the converter in series.

39. The adapter according to claim 38, wherein the rectifier is a diode bridge.

40. The adapter according to claim 31, further comprising a protector, coupled between the second side of the converter and the testing switch electrically, wherein the protector is an over-voltage protector, an over-current protector or a short circuit protector.

41. The adapter according to claim 31, further comprising a PWM controller, one terminal of the PWM controller is coupled to the first side of the converter electrically, the PWM controller detects energy variations of auxiliary winding at the first side of the converter to control the first side of the converter for adjusting energy transmitted to the converter from the inputting terminal.

42. The adapter according to claim 31, further comprising a PWM controller and a feedback circuit, one terminal of the PWM controller is coupled to the first side of the converter electrically, another terminal of the PWM controller is coupled to the feedback circuit, the feedback circuit is coupled between the second side of the converter and the PWM controller electrically, the PWM controller detects the output of the feedback circuit to control the first side of the converter for adjusting energy transmitted to the converter from the inputting terminal.

43. The adapter according to claim 31, wherein the converter is a transformer, an isolated converter, an isolated transformer, a non-isolated converter, or a non-isolated transformer.

44. The adapter according to claim 31, wherein the testing switch is switched between a conductive state and a disconnected state.

45. The adapter according to claim 31, further comprising a switching circuit, one terminal of the switching circuit is coupled to the second side of the converter electrically, another terminal of the switching circuit is coupled to an auxiliary power, the switching circuit detects the output at the second side of the converter for controlling the electrical discharge of the auxiliary power.

* * * * *